United States Patent [19]
Fukunaga

[11] Patent Number: 5,099,138
[45] Date of Patent: Mar. 24, 1992

[54] SWITCHING DEVICE DRIVING CIRCUIT

[75] Inventor: Masanori Fukunaga, Fukuoka, Japan

[73] Assignee: Mitsubishi Denki Kabushiki Kaisha, Tokyo, Japan

[21] Appl. No.: 551,995

[22] Filed: Jul. 12, 1990

[30] Foreign Application Priority Data

Nov. 22, 1989 [JP] Japan .................. 1-305346

[51] Int. Cl.⁵ .......................................... H03K 17/60
[52] U.S. Cl. ...................... 307/248; 307/571; 307/254; 307/443; 307/270
[58] Field of Search ............... 307/270, 443, 571, 576, 307/592, 594, 597, 248, 254

[56] References Cited

U.S. PATENT DOCUMENTS

| | | | |
|---|---|---|---|
| 4,682,054 | 7/1987 | McLaughlin | 307/443 |
| 4,733,110 | 3/1988 | Hara et al. | 307/443 |
| 4,783,690 | 11/1988 | Walden et al. | 357/28 |
| 4,814,638 | 3/1989 | Weick | 307/270 |
| 4,825,102 | 4/1989 | Iwasawa et al. | |
| 4,876,635 | 10/1989 | Park et al. | 363/17 |
| 4,902,914 | 2/1990 | Masuoka | 307/571 |
| 4,910,416 | 3/1990 | Salcone | 307/270 |
| 5,001,365 | 3/1991 | Murabayashi et al. | 307/443 |
| 5,001,369 | 3/1991 | Lee | 307/592 |

FOREIGN PATENT DOCUMENTS

58-170379 10/1983 Japan .

Primary Examiner—Stanley D. Miller
Assistant Examiner—Terry D. Cunningham
Attorney, Agent, or Firm—Oblon, Spivak, McClelland, Maier & Neustadt

[57] ABSTRACT

Upper and lower arm monitoring circuits (13U, 13L) monitor on/off states of upper and lower arm switching devices (2U, 2L). The on/off command signal generating part (7) generates command signals for directing on/off of the switching devices (2U, 2L). Upper and lower arm decision circuits (12U, 12L) alternatively drive the upper and lower arm switching devices (2U, 2L) under predetermined conditions on the basis of monitoring signals from the monitoring circuit (13U, 13L) and the command signals. Thus, a dead time is necessarily automatically provided between the turning-off of one of the switching devices (2U, 2L) and the turning-on of the other of the switching devices (2U, 2L), without setting an upper and lower arm dead time for the command signals.

9 Claims, 8 Drawing Sheets

SWITCHING DEVICE DRIVING CIRCUIT

BACKGROUND OF THE INVENTION

1. Field of the Invention

The present invention relates to a switching device driving circuit for driving switching devices which are totem-pole connected between a high-potential power terminal and a low-potential power terminal.

2. Description of the Background Art

Figure 1:
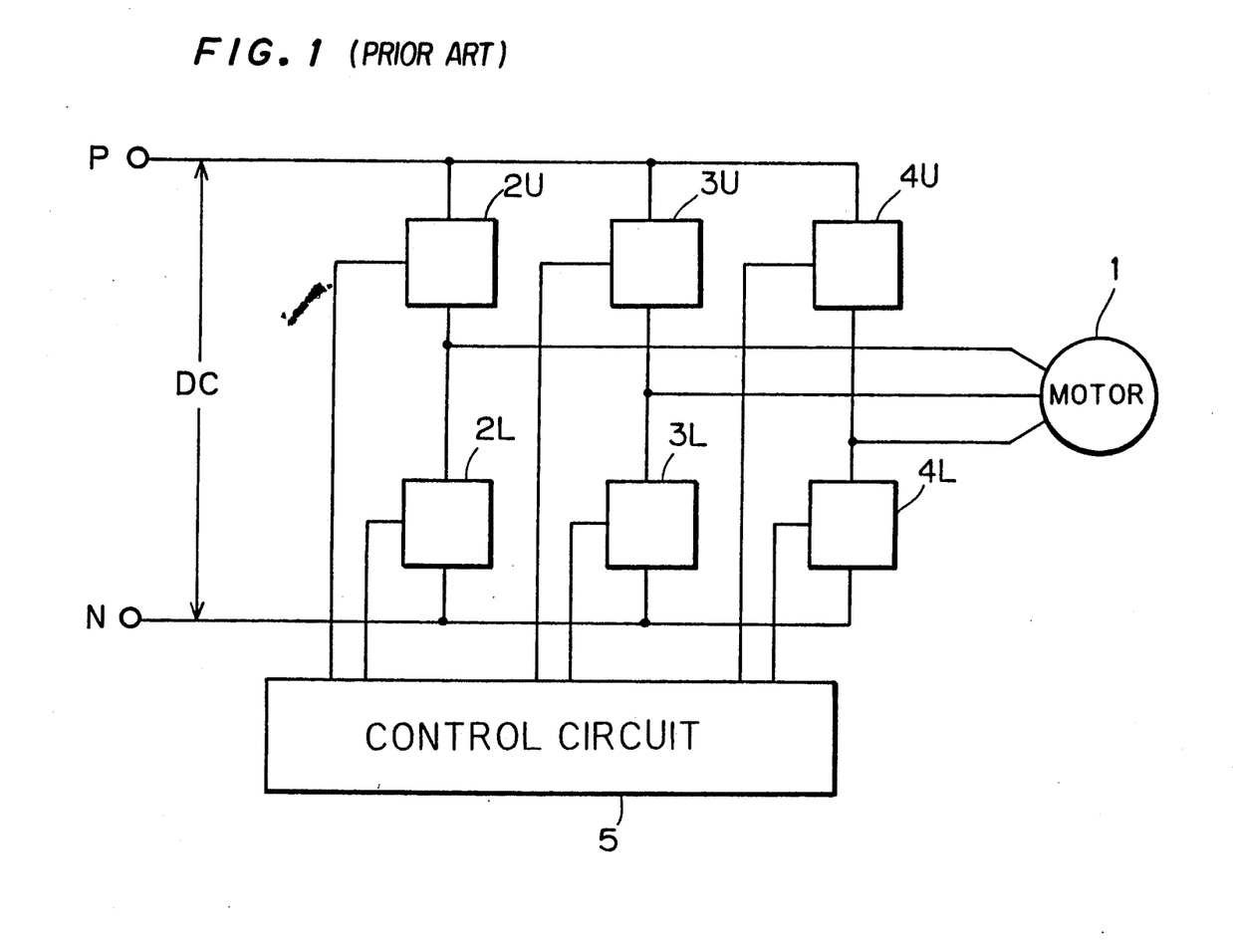
FIG. 1 is a block diagram showing a conventional three-phase PWM inverter circuit.

FIG. 1 is a block diagram showing a PWM inverter circuit of a three-phase bridge structure, which is generally employed for driving a motor 1 such as a three-phase brushless motor, for example. As shown in FIG. 1, three pairs of totem-pole connected power switching devices 2U and 2L, 3U and 3L and 4U and 4L are arranged in parallel between a high-potential power terminal P and a low-potential power terminal N. The power switching devices 2U, 2L, 3U, 3L, 4U and 4L are turned on/off by control signals from a control circuit 5.

Figure 2:
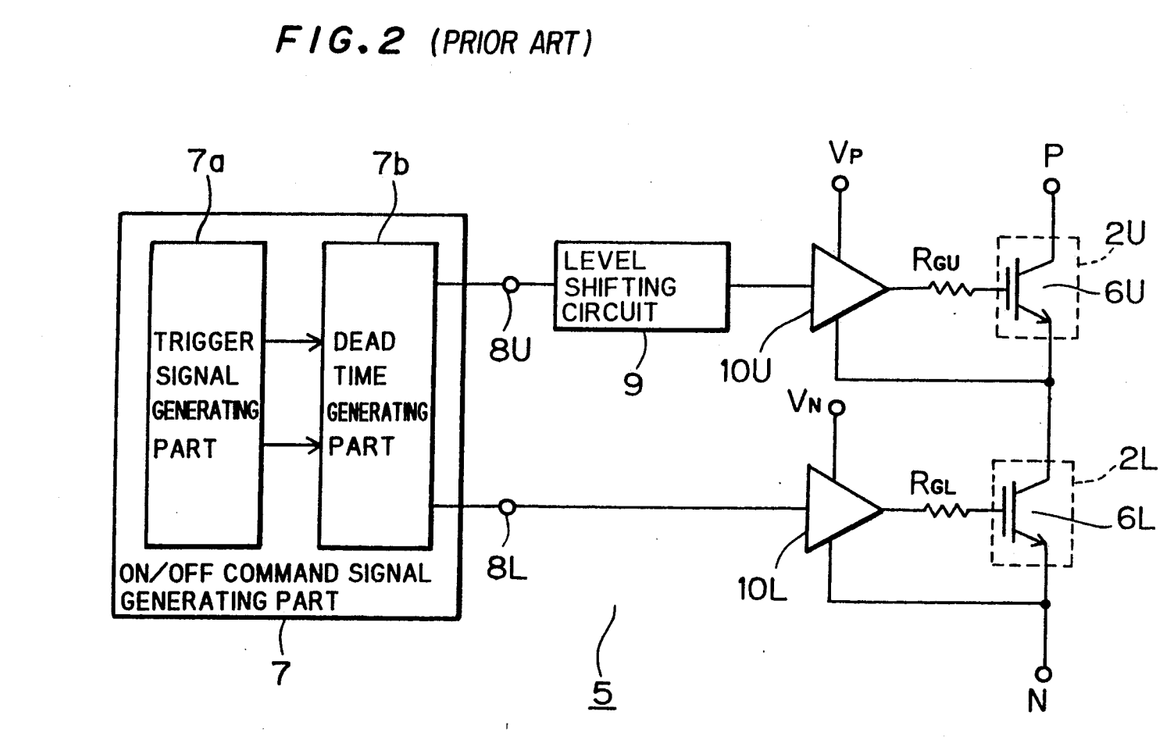
FIG. 2 is a block diagram showing a conventional switching device driving circuit.

FIG. 2 is a block diagram showing a portion of the control circuit 5 which is related to single-phase power switching devices 2U and 2L. In the circuit shown in FIG. 2, insulated gate bipolar transistors (hereinafter referred to as IGBTs) 6U and 6L are employed as the power switching devices 2U and 2L.

Figure 4:
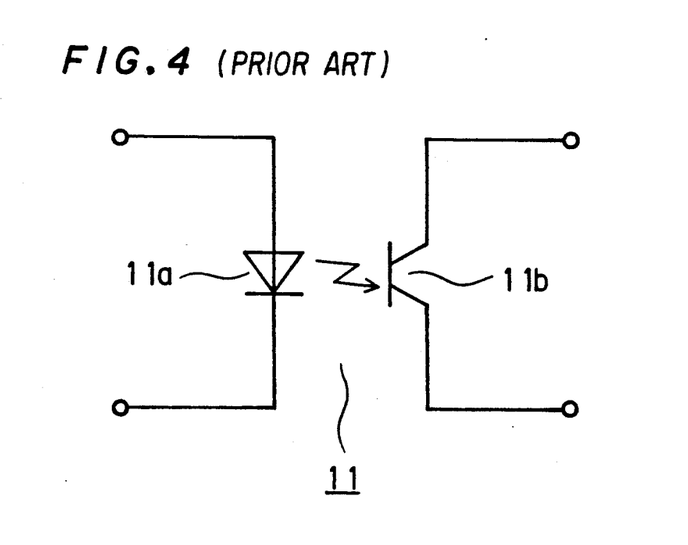
FIG. 4 is a circuit diagram showing an exemplary structure of a level shifting circuit.

Referring to FIG. 2, an on/off command signal generating part 7 generates command signals for directing on/off of the IGBTs 6U and 6L, and supplies the same to an input terminal 8U of an upper arm of a high-voltage side and another input terminal 8L of a lower arm of a low-voltage side, respectively. The command signal received in the input terminal 8U is shifted up in level in a level shifting circuit 9 and inputted in a driving amplifier 10U to which a high source voltage $V_P$ is applied, while the command signal received in the input terminal 8L is directly inputted in a driving amplifier 10L, to which a low source voltage $V_N$ is applied. The level shifting circuit 9 may be prepared from a photocoupler 11, which is formed by a light emitting element 11a and a light receiving element 11b as shown in FIG. 4, for example. The command signal from the input terminal 8U is applied to the light emitting element 11a and the light receiving element 11b is connected to the high source voltage $V_P$, thereby generating a command signal of a high-voltage level. The driving amplifiers 10U and 10L amplify the received command signals. The output of the driving amplifier 10U is applied to the gate of the upper arm IGBT 6U through a gate resistor $R_{GU}$, while the output of the driving amplifier 10L is applied to the gate of the lower arm IGBT 6L through another gate resistor $R_{GL}$.

Figure 3:
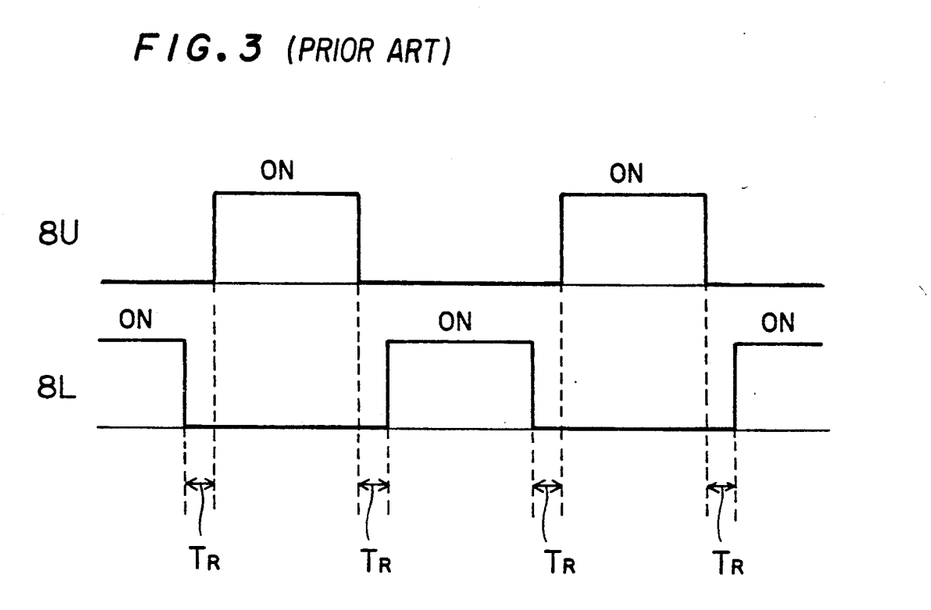
FIG. 3 is a timing chart showing upper and lower arm dead times for command signals.

FIG. 3 is a timing chart showing the on/off command signals which are applied to the input terminals 8U and 8L. Provided that the upper arm IGBT 6U and the lower arm IGBT 6L are simultaneously turned on, a short-circuit is caused across the high-potential power terminal P and the low-potential power terminal N and a large short-circuit current flows to the IGBTs 6U and 6L, so that the IGBTs 6U and 6L may be broken down. In order to prevent this, upper and lower arm dead times $T_R$ are provided between the on/off command signals which are applied to the input terminals 8U and 8L. To this end, the on/off command signal generating part 7 shown in FIG. 2 comprises a trigger signal generating part 7a and a dead time generating part 7b. The trigger signal generating part 7a produces signals in consideration of no upper and lower arm dead times $T_R$, while the dead time generating part 7b provides the upper and lower arm dead times $T_R$ for the signals. These functions of the trigger signal generating part 7a and the dead time generating part 7b are implemented through a microcomputer, for example. Alternatively, the function of the trigger signal generating part 7a may be implemented by a microcomputer, while the function of the dead time generating part 7b may be implemented by a circuit such as a delay logic circuit.

In the conventional switching device driving circuit having the aforementioned structure, the upper and lower arm dead times $T_R$ must necessarily be provided between the on/off command signals for the upper and lower arms. Thus, processing for generating the on/off command signals is complicated, and the load for the microcomputer is significantly increased particularly in the case of high-frequency switching.

On the other hand, the time interval of the upper and lower arm dead times $T_R$ is determined depending on turn-on and turn-off times of the power switching devices and delay times of the driving amplifiers. The turn-on and turn-off times of the power switching devices are varied with the types and capacity of the power switching devices, or load conditions. It has been necessary to set the time interval of the upper and lower arm dead times $T_R$, which is generally set at a fixed period, at the longest period determined under the worst condition. Further, disadvantageously, the upper and lower arm dead times $T_R$ must be re-set when the types of the power switching devices or the load conditions are changed.

SUMMARY OF THE INVENTION

The present invention is directed to a switching device driving circuit for driving first and second switching devices being totem-pole connected between a high-potential power terminal and a low-potential power terminal.

A switching device driving circuit in accordance with the present invention comprises first monitoring means connected with the first switching device for monitoring on/off states of the first switching device to provide a first monitoring signal, second monitoring means connected with the second switching device for monitoring on/off states of the second switching device to provide a second monitoring signal, command signal providing means for providing a first command signal directing on/off of the first switching device and a second command signal directing on/off of the second switching device, first driving means connected with the second monitoring means and the command signal providing means for receiving the second monitoring signal and the first command signal to supply a first driving signal for turning on the first switching device to the first switching device when the second monitoring signal indicates an off state of the second switching device and the first command signal directs turn-on of the first switching device, and second driving means coupled with the first monitoring means and the command signal providing means for receiving the first monitoring signal and the second command signal to supply a second driving signal for turning on the second switching device to the second switching device when the first monitoring signal indicates an off state of the first switching device and the second command signal directs turn-on of the second switching device.

According to the present invention, since a switching device driving circuit comprises first and second monitoring means for monitoring on/off states of totem-pole connected first and second switching devices and first and second driving means for alternatively driving the first and second switching devices under predetermined conditions on the basis of monitoring signals received from the first and second monitoring means and command signals directing on/off of the first and second switching devices, a dead time is necessarily automatically provided between the turning-off of one of the switching devices and the turning-on of the other switching device without setting an upper and lower arm dead time for the command signals directing on/off of the first and second switching devices, so that proper upper and lower arm dead times are regularly obtained even if the types of the switching devices or loading conditions are changed.

Accordingly, an object of the present invention is to provide a switching device driving circuit which can regularly obtain proper upper and lower arm dead times with no necessity for previous setting of such dead times, even if the types of switching devices or loading conditions are changed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
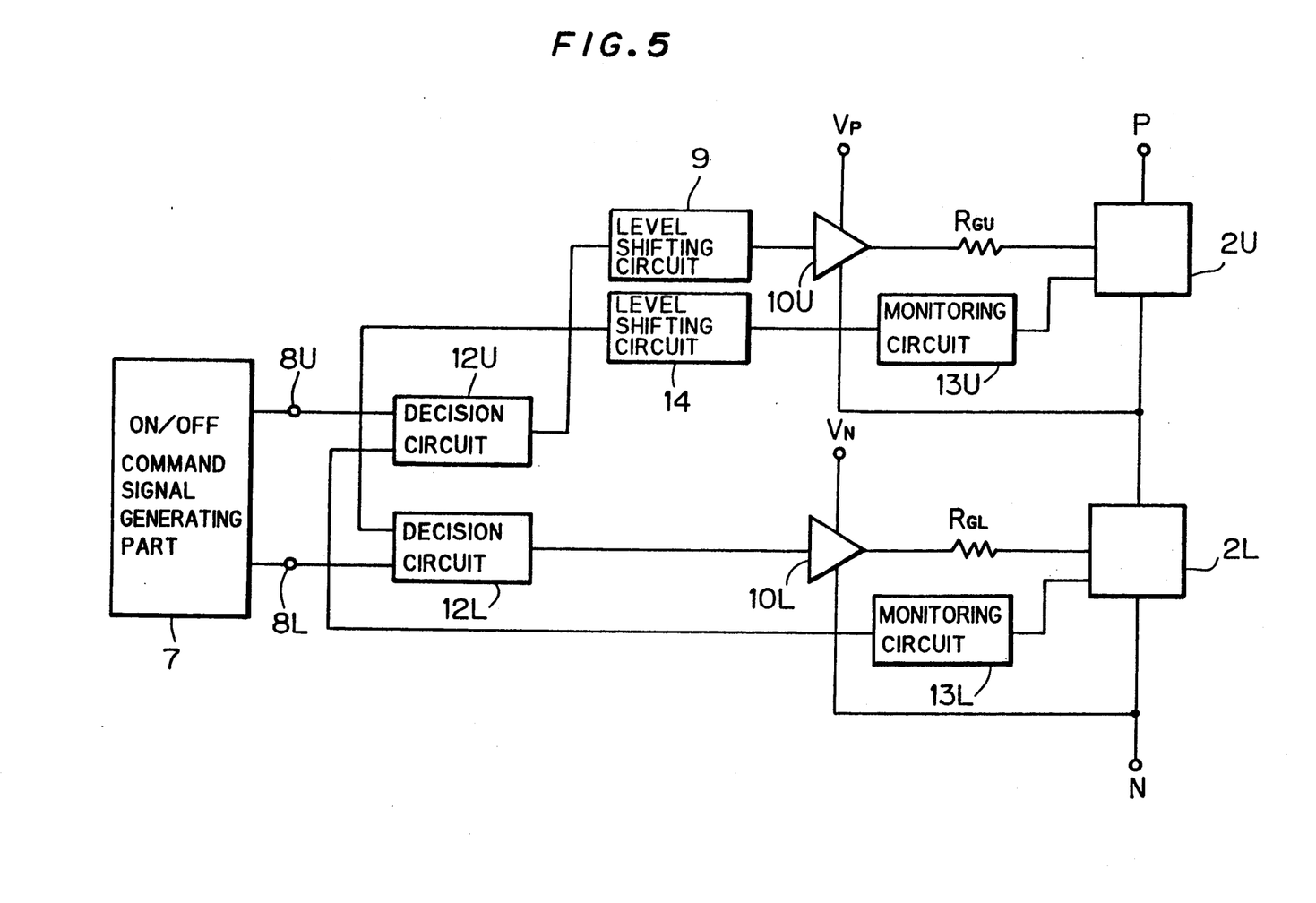
FIG. 5 is a block diagram showing an embodiment of a switching device driving circuit according to the present invention.

FIG. 5 is a block diagram showing an embodiment of a switching device driving circuit according to the present invention. Similarly to FIG. 2, FIG. 5 illustrates only single-phase power switching devices 2U and 2L which are totem-pole connected between a high-potential power terminal P and a low-potential power terminal N.

Referring to FIG. 5, an on/off command signal generating part 7 generates command signals for directing on/off of the power switching devices 2U and 2L, and supplies the same to input terminals 8U and 8L, respectively. The command signals received in the input terminals 8U and 8L are inputted in decision circuits 12U and 12L, respectively. Monitoring circuits 13U and 13L monitor on/off states of the power switching devices 2U and 2L, respectively. The output from the monitoring circuit 13U of an upper arm side is shifted down in level by a level shifting circuit 14 and inputted in the decision circuit 12L of a lower arm side, while the output of the monitoring circuit 13L of the lower arm side is directly inputted in the decision circuit 12U of the upper arm side. The level shifting circuit 14 may be prepared from the photocoupler 11 shown in FIG. 4, for example. To accomplish this one of the two input terminals of the photocoupler 11 is connected to the intermediate node (to which the driving amplifier 10U is connected) between the power switching devices 2U and 2L, with the other being connected to the monitoring circuit 13U. One of the two output terminals is connected to ground with the other being connected to the decision circuit 12L.

When a command signal received from the on/off command signal generating part 7 directs turn-on of the power switching device 2U of the upper arm side and the output from the monitoring circuit 13L indicates an off state of the power switching device 2L of the lower arm side, the decision circuit 12U outputs a driving signal for turning on the power switching device 2U of the upper arm side. This driving signal is shifted up in level by the level shifting circuit 9, which is formed by the photocoupler 11 shown in FIG. 4, for example, and applied to the gate of the power switching device 2U of the upper arm side through a driving amplifier 10U and a gate resistor $R_{GU}$. Thus, the power switching device 2U of the upper arm side is turned on. It should be noted that of the two input terminals of the photocoupler 11 one of these is connected to ground (not shown) and the other is connected to a decision circuit 12U. One of the two output terminals of the same is connected to the intermediate node (to which the driving amplifier 10U is connected) between the power switching device 2U and 2L, and the other, to the driving amplifier 10U.

When a command signal received from the on/off command signal generating part 7 directs turn-on of the power switching device 2L of the lower arm side and the output from the monitoring circuit 13U indicates an off state of the power switching device 2U of the upper arm side, on the other hand, the decision circuit 12L outputs a driving signal for turning on the power switching device 2L of the lower arm side. This driving signal is applied to the gate of the power switching device 2L of the lower arm side through a driving amplifier 10L and a gate resistor $R_{GL}$. Thus, the power switching device 2L of the lower arm side is turned on.

Figure 6:
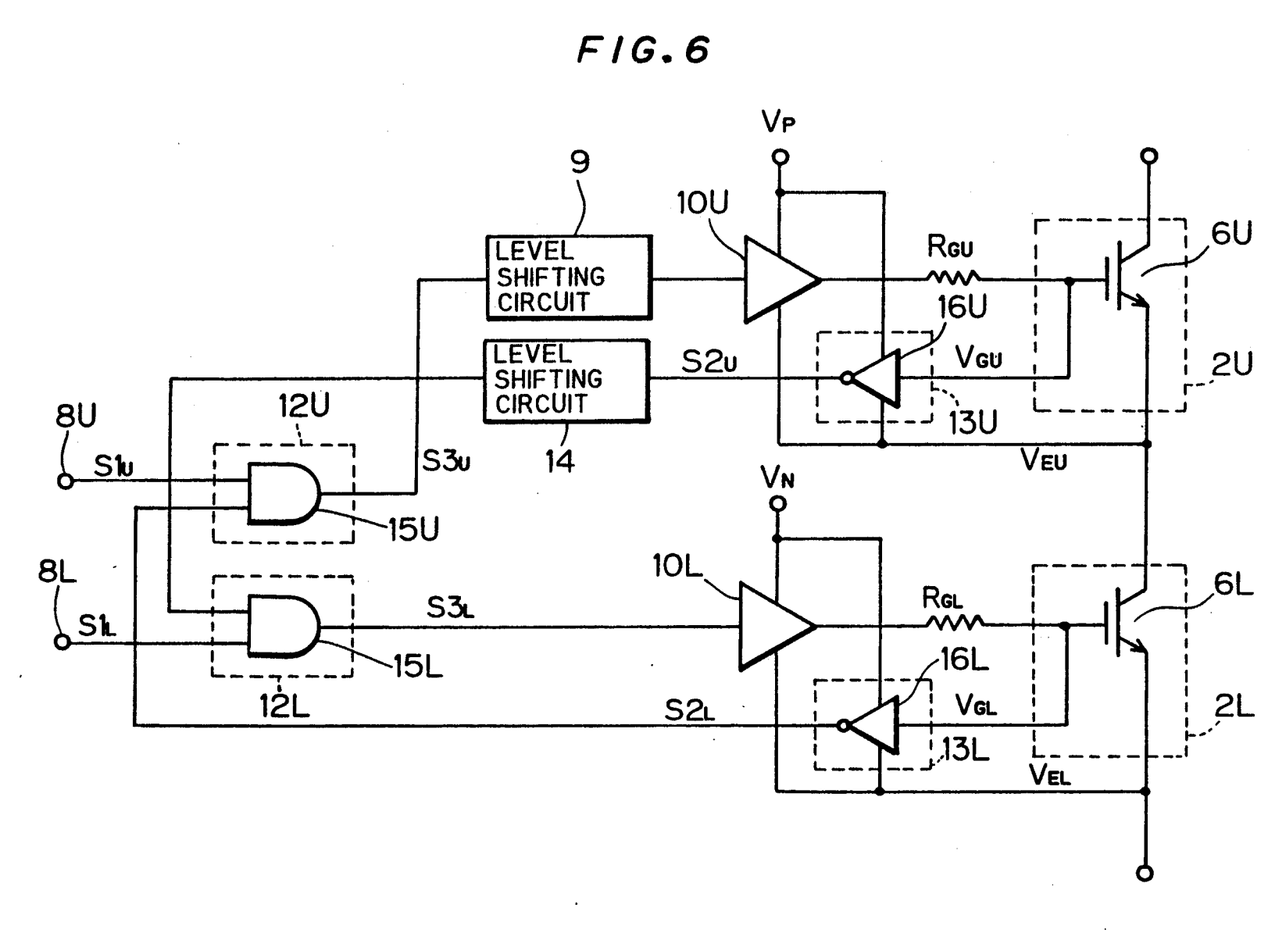
FIG. 6 is a block diagram showing a circuit materializing the embodiment shown in FIG. 5.

FIG. 6 is a block diagram showing an exemplary structure implemented by employing IGBTs 6U and 6L, AND gates 15U and 15L and inverters 16U and 16L as the power switching devices 2U and 2L, the decision circuits 12U and 12L and the monitoring circuits 13U and 13L shown in FIG. 5, respectively. The operation of the circuit shown in FIG. 6 will now be described with reference to a timing chart shown in FIG. 7.

Figure 7:
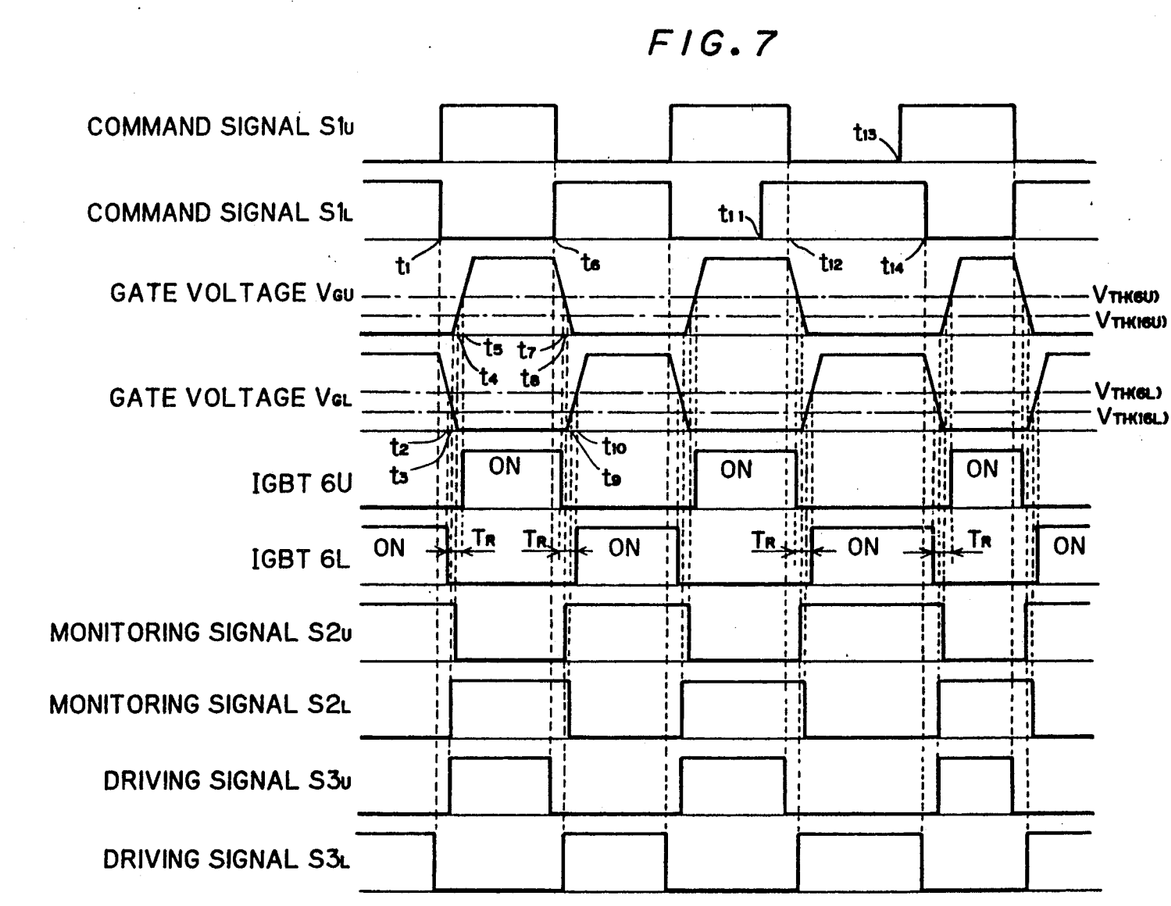
FIG. 7 is a timing chart showing the operation of the circuit shown in FIG. 6.

It is assumed that a command signal $S1_L$ received in the input terminal 8L falls from a high level directing turn-on of the IGBT 6L of the lower arm side to a low level directing turn-off while a command signal $S1_U$ received in the input terminal 8U simultaneously rises from a low level directing turn-off of the IGBT 6U of the upper arm side to a high level directing turn-on, at a time $t_1$. A driving signal $S3_L$ outputted from the AND gate 15L falls to a low level in response to the low level of the command signal $S1_L$, whereby a gate voltage $V_{GL}$ (i.e., voltage value based on an emitter voltage $V_{EL}$) of the IGBT 6L starts lowering. The inverter 16L receives the gate voltage $V_{GL}$ in order to monitor on-/off states of the IGBT 6L. The IGBT 6L is turned off at a time $t_2$ when the gate voltage $V_{GL}$ goes lower than a threshold voltage $V_{TH(6L)}$ of the IGBT 6L. A threshold voltage $V_{TH(16L)}$ of the inverter 16L is set lower than the threshold voltage $V_{TH(6L)}$ of the IGBT 6L. After the IBGT 6L is turned off, the gate voltage $V_{GL}$ goes lower than the threshold voltage $V_{TH(16L)}$ of the inverter 16L at a time $t_3$, whereby a monitoring signal $S_{2L}$ outputted from the inverter 16L rises from a low level to a high level.

The high-level command signal $S1_U$ is currently inputted in the AND gate 15U, and hence a driving signal $S3_U$ outputted from the AND gate 15U rises from a low level to a high level when the monitoring signal $S_{2L}$, which is another input of the AND gate 15U, goes high. In response to this, a gate voltage $V_{GU}$ (i.e., voltage value based on an emitter voltage $V_{EU}$) starts rising. A monitoring signal $S2_U$ outputted from the inverter 16U falls from a high level to a low level at a time $t_4$ when the gate voltage $V_{GU}$ exceeds the threshold voltage $V_{TH(16U)}$ of the inverter 16U, and the IGBT 6U is turned on at a time $t_5$ when the gate voltage $V_{GU}$ exceeds the threshold voltage $V_{TH(6U)}$ of the IGBT 6U.

Thus, a dead time having a time width $T_R$ is defined between the turning-off of the IGBT 6L and the turning-on of the IGBT 6U.

It is assumed that the command signal $S1_U$ falls to a low level and the command signal $S1_L$ rises to a high level at a time $t_6$. In response to the low level of the command signal $S1_U$, a driving signal $S3_U$ outputted from the AND gate 15U falls to a low level, whereby the gate voltage $V_{GU}$ of the IGBT 6U starts lowering. The inverter 16U receives the gate voltage $V_{GU}$ in order to monitor on/off states of the IGBT 6U. The gate voltage $V_{GU}$ goes lower than the threshold voltage $V_{TH(6U)}$ of the IGBT 6U at a time $t_7$, whereby the IGBT 6U is turned off. The threshold voltage $V_{TH(16U)}$ of the inverter 16U is set lower than the threshold voltage $V_{TH(6U)}$ of the IGBT 6U. After the IGBT 6U is turned off, the gate voltage $V_{GU}$ goes lower than the threshold voltage $V_{TH(16U)}$ of the inverter 16U at a time $t_8$, whereby the monitoring signal $S2_U$ outputted from the inverter 16U rises from the low level to a high level.

The high-level command signal $S1_L$ is currently inputted in the AND gate 15L, and hence the driving signal $S3_L$ outputted from the AND gate 15L rises from the low level to a high level when the monitoring signal $S2_U$, which is another input of the AND gate 15L, goes high. In response to this, the gate voltage $V_{GL}$ of the IGBT 6L starts rising. The monitoring signal $S2_L$ outputted from the inverter 16L falls from the high level to a low level at a time $t_9$ when the gate voltage $V_{GL}$ exceeds the threshold voltage $V_{TH(16L)}$ of the inverter 16L, and the IGBT 6L is turned on at a time $t_{10}$ when the gate voltage $V_{GL}$ exceeds the threshold voltage $V_{TH(6L)}$ of the IGBT 6L.

Thus, another dead time of the time width $T_R$ is also defined between the turning-off of the IGBT 6U and the turning-on of the IGBT 6L.

Then, it is assumed that the command signal $S1_L$ also goes high at a time $t_{11}$ when the command signal $S1_U$ is at a high level. The monitoring signal $S2_U$ outputted from the inverter 16U is currently at a low level for indicating an on state of the IGBT 6U, and hence the driving signal $S3_L$ outputted from the AND gate 15L keeps the low level attained before the command signal $S1_L$ goes high. Thus, the IGBT 6L is prevented from turn-on in response to the high level of the command signal $S1_L$ when the IGBT 6U is in the on state in response to the high level of the command signal $S1_U$. The command signal $S1_U$ falls from the high level to a low level at a time $t_{12}$, whereby the IGBT 6U is turned off and the IGBT 6L is turned off absolutely similarly to the aforementioned operation after the time $t_6$. The dead time $T_R$ is defined at this time, as hereinabove described.

It is assumed that the command signal $S1_U$ also goes high at a time $t_{13}$ when the command signal $S1_L$ is at a high level. The monitoring signal $S2_L$ outputted from the inverter 16L is at a low level indicating an on state of the IGBT 6L, and hence the driving signal $S3_U$ outputted from the AND gate 15U keeps the low level attained before the command signal $S1_U$ goes high. Thus, the IGBT 6U is prevented from turn-on in response to the high level of the command signal $S1_U$ when the IGBT 6L is in the on state in response to the high level of the command signal $S1_L$. The command signal $S1_L$ falls from the high level to a low level at a time $t_{14}$, whereby the IGBT 6L is turned off and the IBGT 6U is turned on absolutely similarly to the aforementioned operation after the time $t_1$. The dead time $T_R$ is defined at this time, as hereinabove described.

Thus, the IGBTs 6U and 6L will not be turned on at the same time even if the command signals $S1_U$ and $S1_L$ simutaneously go high, while the dead time $T_R$ is necessarily defined between the turning-off of one of the IGBTs and the turning-on of the other IGBT.

According to the embodiment, as hereinabove described, the IGBTs 6U and 6L will not conduct at the same time even if absolutely no dead time is provided between the command signals $S1_U$ and $S1_L$ or the command signals $S1_U$ and $S1_L$ simutalneously go high. Further, the proper dead time $T_R$ is necessarily produced between the turning-off of one of the IGBTs 6U and 6L and the turning-on of the other one.

The embodiment shown in FIG. 6 can be modified in various ways. Modes of preferable modifications will now be described.

Figure 8:
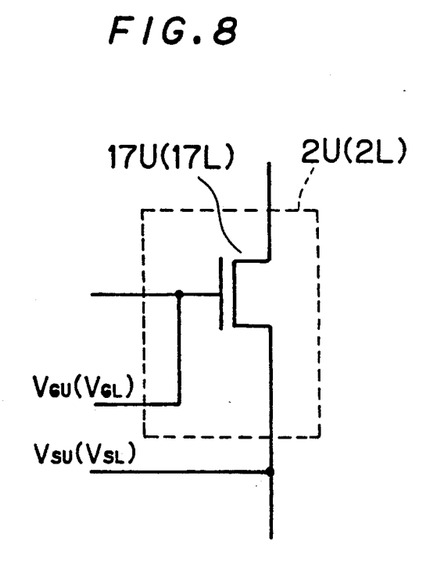
FIG. 8 to FIG. 13 are circuit diagrams showing various exemplary structures for monitoring on/off states of switching devices.
Figure 9:
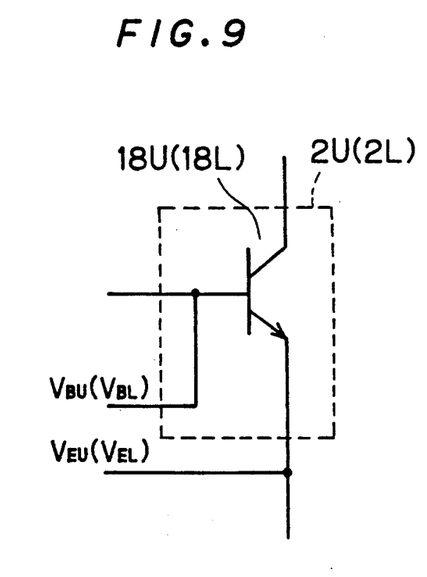

(i) In place of the aforementioned IGBT 6U (6L), the power switching device 2U (2L) may be prepared from a voltage control type device which is similar to an IGBT, such as a power MOSFET 17U (17L) shown in FIG. 8, for example. Alternatively, a bipolar transistor 18U (18L) may be employed as shown in FIG. 9. In order to monitor on/off states of the power MOSFET 17U (17L) shown in FIG. 8, its gate voltage $V_{GU}(V_{GL})$ (i.e., voltage value based on a source voltage $V_{SU}$ ($V_{SL}$)) may be detected by the inverter 16U (16L) shown in FIG. 6, similarly to the case of the aforementioned IGBT 6U (6L), for example. In order to monitor on/off states of the bipolar transistor 18U (18L) shown in FIG. 9, on the other hand, its base voltage $V_{BU}(V_{BL})$ (i.e., voltage value based on an emitter voltage $V_{EU}$ ($V_{EL}$)) may be detected by the inverter 16U (16L) shown in FIG. 6, similarly to the case of the aforementioned IGBT 6U (6L), for example.

Figure 10:
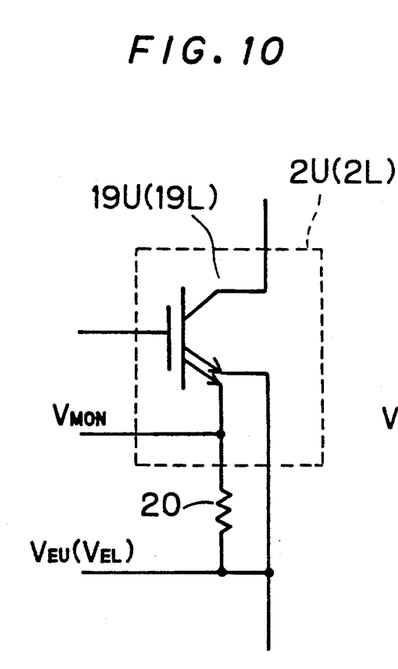

(ii) The aforementioned IGBT 6U (6L) may be replaced by an IGBT 19U (19L) shown in FIG. 10, which contains a current detecting terminal as disclosed in Japanese Patent Laying-Open Gazette No. 60-94772 (U.S. Ser. No. 529,240), for example. In order to monitor on/off states of the IGBT 19U (19L), a current detecting resistor 20 may be connected to the current detecting terminal to detect a voltage $V_{MON}$ (i.e., voltage value based on an emitter voltage $V_{EU}(V_{EL})$) generated in the current detecting resistor 20 in response to a current flowing in the IGBT 19U (19L) by the inverter 16U (16L) shown in FIG. 6, for example.

Figure 11:
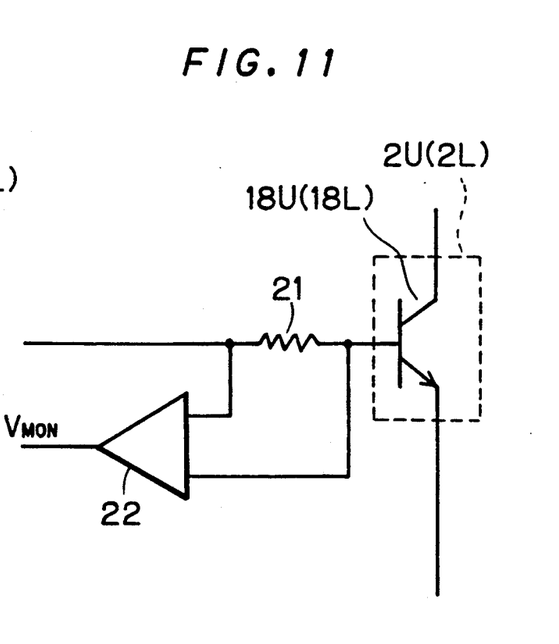
Figure 12:
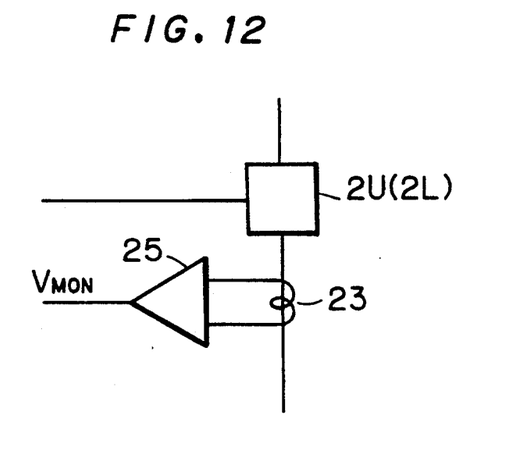
Figure 13:
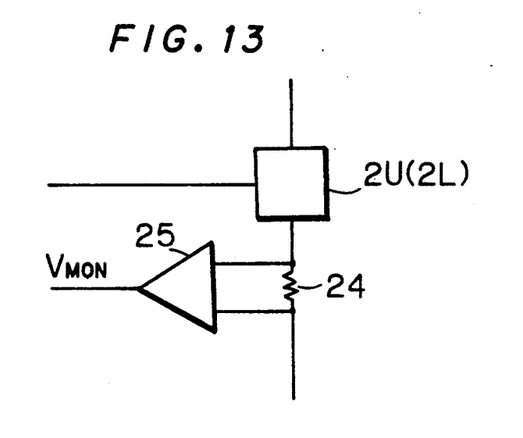

(iii) In order to detect on/off states of the bipolar transistor 18U (18L), a current detecting resistor 21 may be connected to the base of the bipolar transistor 18U (18L) to derive a voltage generated across the resistor 21 as a monitor voltage $V_{MON}$ through an amplifier 22, as shown in FIG. 11. As an on/off monitoring method which is applicable to every type of switching device 2U (2L), a current transformer 23 shown in FIG. 12 or a current detecting resistor 24 shown in FIG. 13 may be inserted in a main current path for the switching device 2U (2L), to derive a voltage induced by the current transformer 23 or generated in the current detecting resistor 24 in response to a main current flowing in the switching device 2U (2L) through an amplifier 25 as a monitor voltage $V_{MON}$. It is possible to detect whether or not the monitor voltage $V_{MON}$ has reached a prescribed voltage level by the inverter 16U (16L) shown in FIG. 6, for example.

Figure 14:
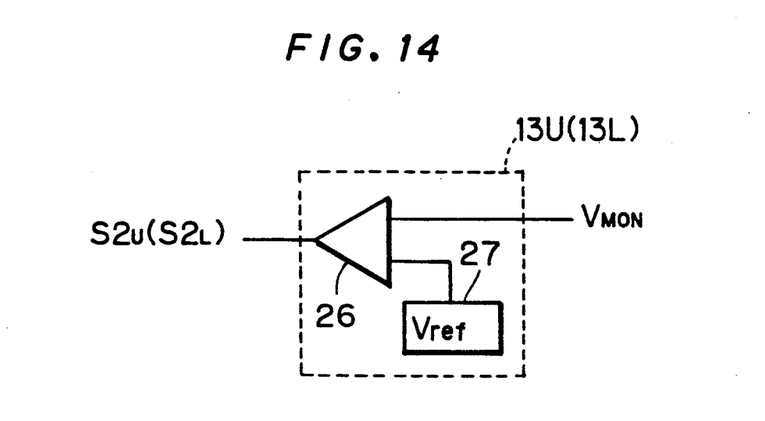
FIG. 14 is a block diagram showing another exemplary structure of a monitoring circuit.

(iv) The monitoring circuit 13U (13L) may be prepared from a voltage comparator 26 shown in FIG. 14, in place of the inverter 16U (16L). The comparator 26 shown in FIG. 14 receives a voltage to be monitored such as a monitor voltage $V_{MON}$ and a previously set reference voltage $V_{ref}$ of a reference voltage source 27, to derive a low-level or high-level monitoring signal $S2_U$ ($S2_L$) depending on whether or not the monitor voltage $V_{MON}$ has exceeded the reference voltage $V_{ref}$.

Although the above embodiment has been described with reference to a switching device driving circuit for a PWM inverter circuit, the present invention is also applicable to all types of driving circuits for switching devices which are totem-pole connected between high-potential power terminals and low-potential power terminals.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A switching device driving circuit for driving first and second switching devices being totem-pole connected between a high-potential power terminal and a low-potential power terminal, comprising:
   first monitoring means comprised of an inverter having a predetermined threshold voltage connected to a control electrode of said first switching device for comparing a voltage of said control electrode of said first switching device with said threshold voltage to monitor on/off states of said first switching device to provide a first monitoring signal;
   second monitoring means connected to said second switching device for monitoring on/off states of said second switching device to provide a second monitoring signal;
   command signal providing means for providing a first command signal directing on/off of said first switching device and a second command signal directing on/off of said second switching device;
   first driving means connected to said second monitoring means and said command signal providing means for receiving said second monitoring signal and said first command signal to supply a first driving signal, for turning on said first switching device, to said first switching device when said second monitoring signal indicates an off state of said second switching device and said first command signal directs turn-on of said first switching device; and
   second driving means coupled to said first monitoring means and said command signal providing means for receiving said first monitoring signal and said second command signal to supply a second driving signal for turning on said second switching device to said second switching device when said first monitoring signal indicates an off state of said first switching device and said second command signal directs turns-on of said second switching device.

2. A switching device driving circuit in accordance with claim 1, wherein
   said predetermined threshold voltage is smaller than a threshold voltage of said first switching device.

3. A switching device driving circuit for driving first and second switching devices being totem-pole connected between a high-potential power terminal and a low-potential power terminal, comprising:
   first monitoring means connected to said first switching device for monitoring on/off states of said first switching device to provide a first monitoring signal;
   second monitoring means comprised of an inverter having a predetermined threshold voltage connected to a control electrode of said second switching device for comparing a voltage of said second switching device with said threshold voltage monitor on/off states of said second switching device to provide a second monitoring signal;
   command signal providing means for providing a first command signal directing on/off of said first switching device and a second command signal directing on/off of said second switching device;
   first driving means connected to said second monitoring means and said command signal providing means for receiving said second monitoring signal and said first command signal to supply a first driving signal, for turning on said first switching device, to said first switching device when said second monitoring signal indicates an off state of said second switching device and said first command signal directs turn-on of said first switching device; and
   second driving means coupled to said first monitoring means and said command signal providing means for receiving said first monitoring signal and said second command signal to supply a second driving signal for turning on said second switching device to said second switching device when said first monitoring signal indicates an off state of said first switching device and said second command signal directs turn-on of said second switching device.

4. A switching device driving circuit in accordance with claim 3, wherein
   said predetermined threshold voltage is smaller than a threshold voltage of said second switching device.

5. A switching device driving circuit for driving first and second switching devices being totem-pole connected between a high-potential power terminal and a low-potential power terminal, comprising:
   first monitoring means connected to said first switching device for monitoring on/-off states of said first switching device to provide a first monitoring signal;

second monitoring means connected to said second switching device for monitoring on/off states of said second switching device to provide a second monitoring signal;

command signal providing means for providing a first command signal direction on/off of said first switching device and a second command signal directing on/off of said second switching device;

first driving means connected to said second monitoring means and said command signal providing means for receiving said second monitoring signal and said first command signal to supply a first driving signal, for turning on said first switching device, to said first switching device when said second monitoring signal indicates an off state of said second switching device and said first command signal directs turn-on of said first switching device;

second driving means coupled to said first monitoring means and said command signal providing means for receiving said first monitoring signal and said second command signal to supply a second driving signal for turning on said second switching device to said second switching device when said first monitoring signal indicates an off state of said first switching device and said second command signal directs turn-on of said second switching device; and wherein said first switching device includes an insulated gate bipolar transistor with a current detecting terminal, and said first monitoring means includes a current detecting resistor connected across said current detecting terminal of said insulated gate bipolar transistor and a connecting node of said first and second switching device.

6. A switching device driving circuit for driving first and second switching devices being totem-pole connected between a high-potential power terminal and a low-potential power terminal, comprising:

first monitoring means connected to said first switching device for monitoring on/off states of said first switching device to provide a first monitoring signal;

second monitoring means connected to said second switching device for monitoring on/off states of said second switching device to provide a second monitoring signal;

command signal providing means for providing a first command signal direction on/off of said first switching device and a second command signal directing on/off of said second switching device;

first driving means connected to said second monitoring means and said command signal providing means for receiving said second monitoring signal and said first command signal to supply a first driving signal, for turning on said first switching device, to said first switching device when said second monitoring signal indicates an off state of said second switching device and said first command signal directs turn-on of said first switching device;

second driving means coupled to said first monitoring means and said command signal providing means for receiving said first monitoring signal and said second command signal to supply a second driving signal for turning on said second switching device to said second switching device when said first monitoring signal indicates an off state of said first switching device and said second command signal directs turn-on of said second switching device; and wherein said first and second switching devices include bipolar transistors, and each said first and second monitoring means includes a current detecting resistor connected with a base of the respective one of said bipolar transistors and an amplifier for amplifying a voltage across said current detecting resistor.

7. A switching device driving circuit in accordance with claim 6, wherein each said first and second monitoring means further includes a reference voltage source for generating a predetermined reference voltage and a voltage comparator for receiving an output of said amplifier and said reference voltage to output said monitoring signal.

8. A switching device driving circuit for driving first and second switching devices being totem-pole connected between a high-potential power terminal and a low-potential power terminal, comprising:

first monitoring means connected to said first switching device for monitoring on/off states of said first switching device to provide a first monitoring signal;

second monitoring means connected to said second switching device for monitoring on/off states of said second switching device to provide a second monitoring signal;

command signal providing means for providing a first command signal direction on/off of said first switching device and a second command signal directing on/off of said second switching device;

first driving means connected to said second monitoring means and said command signal providing means for receiving said second monitoring signal and said first command signal to supply a first driving signal, for turning on said first switching device, to said first switching device when said second monitoring signal indicates an off state of said second switching device and said first command signal directs turn-on of said first switching device;

second driving means coupled to said first monitoring means and said command signal providing means for receiving said first monitoring signal and said second command signal to supply a second driving signal for turning on said second switching device to said second switching device when said first monitoring signal indicates an off state of said first switching device and said second command signal directs turn-on of said second switching device; and wherein each said first and second monitoring means includes a current transformer connected in series with a main current path of said first and second switching devices and an amplifier for amplifying a voltage induced by said current transformer.

9. A switching device driving circuit for driving first and second switching devices being totem-pole connected between a high-potential power terminal and a low-potential power terminal, comprising:

first monitoring means connected to said first switching device for monitoring on/off states of said first switching device to provide a first monitoring signal;

second monitoring means connected to said second switching device for monitoring on/off states of said second switching device to provide a second monitoring signal;

command signal providing means for providing a first command signal direction on/off of said first switching device and a second command signal directing on/off of said second switching device;

first driving means connected to said second monitoring means and said command signal providing means for receiving said second monitoring signal and said first command signal to supply a first driving signal, for turning on said first switching device, to said first switching device when said second monitoring signal indicates an off state of said second switching device and said first command signal directs turn-on of said first switching device;

second driving means coupled to said first monitoring means and said command signal providing means for receiving said first monitoring signal and said second command signal to supply a second driving signal for turning on said second switching device to said second switching device when said first monitoring signal indicates an off state of said first switching device and said second command signal directs turn-on of said second switching device; and wherein said second switching device includes an insulated gate bipolar transistor with a current detecting terminal, and said second monitoring means includes a current detecting resistor connected across said current detecting terminal of said insulated gate bipolar transistor and said low-potential power terminal.

* * * * *